US012264064B2

(12) United States Patent
Cargill

(10) Patent No.: US 12,264,064 B2
(45) Date of Patent: Apr. 1, 2025

(54) MICROELECTROMECHANICAL SYSTEM

(71) Applicant: AAC ACOUSTIC TECHNOLOGIES (SHENZHEN) CO., LTD., Shenzhen (CN)

(72) Inventor: Scott Lyall Cargill, Eb (GB)

(73) Assignee: AAC ACOUSTIC TECHNOLOGIES (SHENZHEN) CO., LTD., Shenzhen (CN)

(*) Notice: Subject to any disclaimer, the term of this patent is extended or adjusted under 35 U.S.C. 154(b) by 555 days.

(21) Appl. No.: 17/320,250

(22) Filed: May 14, 2021

(65) Prior Publication Data
US 2022/0363533 A1 Nov. 17, 2022

(51) Int. Cl.
*B81B 3/00* (2006.01)
(52) U.S. Cl.
CPC .... *B81B 3/0086* (2013.01); *B81B 2201/0257* (2013.01); *B81B 2203/0127* (2013.01); *B81B 2203/0136* (2013.01); *B81B 2203/0346* (2013.01)
(58) Field of Classification Search
CPC .... H04R 19/04; H04R 7/04; H04R 2201/003; H04R 7/14; B81B 2201/0257; B81B 2203/0127; B81B 2203/0136; B81B 2201/033; B81B 3/0086; B81B 2203/0346; B81B 3/007
See application file for complete search history.

(56) References Cited

U.S. PATENT DOCUMENTS

| 5,870,482 A * | 2/1999 | Loeppert | G01H 11/06 381/174 |
| 7,961,897 B2 * | 6/2011 | Weigold | H04R 7/14 381/174 |
| 2011/0241137 A1 * | 10/2011 | Huang | H01L 27/0617 257/419 |
| 2019/0342672 A1 * | 11/2019 | Cai | H04R 7/16 |

* cited by examiner

Primary Examiner — Khaja Ahmad
Assistant Examiner — Sun Mi Kim King
(74) Attorney, Agent, or Firm — W&G Law Group

(57) ABSTRACT

A microelectromechanical system includes a backplate and a diaphragm. The backplate includes spaced stator elements with voids formed therebetween. The stator element includes a first conductive element. The diaphragm includes a plurality of corrugations facing the voids respectively. Each corrugation includes a groove formed at a surface thereof away from the backplate. The corrugation includes a second conductive element. The diaphragm is moveable with respect to the backplate in response to a pressure exerted thereon to cause the corrugations to be moved into or out of the corresponding voids, thereby changing the capacitance formed between the first and second conductive elements. The corrugations are defined by grooves formed at surfaces away from the backplate, which facilitate to control the compliance of the diaphragm and reduce stiffness of the diaphragm. The corrugation can be formed with lower aspect ratios, which allows it to be formed using standard front side processes.

17 Claims, 8 Drawing Sheets

MICROELECTROMECHANICAL SYSTEM

FIELD OF THE INVENTION

The present disclosure relates to the field of electro-acoustic conversion devices, and in particular, to a microelectromechanical system for electro-acoustic conversion devices.

BACKGROUND

Comb drives are widely used in electro-acoustic conversion devices. A typical comb drive comprises one comb attached to a moving element and another comb attached to a stationary element. The comb comprises a finger type electrode typically with a high aspect ratio and a mechanical stiffness order of magnitude higher than the moving element. The moving element can be a proof mass, a cantilever or a diaphragm. Displacement of the moving element causes a displacement of the combs relative to each other. The displacement causes an output voltage to vary proportionate to the displacement of the combs. Comb drives have a particular advantage to microelectromechanical system microphones in that the comb drives can be arranged to give a sliding motion relative to each other, instead of a squeezing motion as happened in most parallel plate type microphones.

However, the higher stiffness of the comb electrode finger with respect to the moving element places a premium on the compliance of the moving element, which makes it difficult to achieve a sensible sensitivity target for a low gain Application Specific Integrated Circuit (ASIC) implementation. The high stiffness also drives a high aspect ratio in order to generate a sufficiently high operational capacitance. Furthermore, special processes, for example expensive Silicon-On-Insulator (SOI) wafers, are required in order to make fingers with high aspect ratio.

Therefore, it is desired to provide an improved microelectromechanical system which can overcome at least one of the above problems.

SUMMARY

In one aspect, the present disclosure provides a microelectromechanical system which comprises a backplate and a diaphragm. The backplate comprises a plurality of spaced stator elements with voids formed therebetween. The stator elements comprising first conductive elements. The diaphragm comprises a plurality of corrugations facing the voids respectively. Each corrugation comprises a groove formed at a surface thereof away from the backplate. The corrugations comprise second conductive elements. The diaphragm is moveable with respect to the backplate in response to a pressure exerted thereon to cause the corrugations to be moved into or out of corresponding voids, thereby changing a capacitance formed between the first and second conductive elements.

In some embodiments, the corrugation comprises an insulating corrugation part, and the second conductive element is corrugation-shaped and embedded in the insulating corrugation part.

In some embodiments, two adjacent second conductive elements are connected with each other via a conductor embedded in an insulating connecting portion connected between two adjacent insulating corrugation parts.

In some embodiments, two adjacent second conductive elements are disconnected from each other such that differential signals can be output via the two adjacent second conductive elements.

In some embodiments, the diaphragm further comprises an insulating body configured to suspend the corrugations, and the insulating body is integrally formed with the insulating corrugation parts.

In some embodiments, the diaphragm further comprises an insulating body configured to suspend the corrugations, the second conductive element is corrugation-shaped, and two adjacent second conductive elements are disconnected from each other and exposed to outside of the insulating body.

In some embodiments, each corrugation extends along a longitudinal direction and the corrugations are arranged in rows along a transverse direction perpendicular to the longitudinal direction.

In some embodiments, the diaphragm has a circle configuration and the corrugations are arranged in concentric rings.

In some embodiments, in a cross section perpendicular to the longitudinal direction, the corrugations are U-shaped or V-shaped.

In some embodiments, a middle line of the corrugation and a middle line of a corresponding void facing the corrugation are aligned with each other and parallel to moving directions of the corrugations.

In some embodiments, the microelectromechanical system further comprises an insulator arranged between a portion of the diaphragm and a portion of the backplate.

In some embodiments, the distance between the middle lines of adjacent two corrugations is in a range of 3 µm to 20 µm, preferably, 6 µm to 10 µm.

In some embodiments, the distance between adjacent two stator elements is in a range of 0.5 µm to 6 µm, preferably 1 µm to 3 µm.

In some embodiments, the diaphragm comprises a body configured for suspending the corrugations, and a distance between the body and the stator elements in a moving direction of the corrugations is in a range of 1.5 µm to 12 µm, preferably 3 µm to 6 µm.

In some embodiments, the backplate further comprises an anchor mounted on a substrate and a plurality of spokes extending from a center of the backplate to the anchor, the anchor and the stator elements being arranged in concentric rings, the stator elements being suspended by the spokes.

In some embodiments, the diaphragm has a circular configuration and the corrugations are arranged in concentric rings; and each ring of corrugation comprises a plurality of spaced arcuate corrugation sections with cutouts formed between adjacent arcuate corrugation sections to allow corresponding spokes to pass through.

In some embodiments, the arcuate corrugation section comprises a pair of opposite round ends each extending toward a corresponding cutout.

The stator elements may protrude beyond surfaces of the spokes facing the diaphragm. Alternatively, the stator elements are formed between adjacent spokes and the surfaces of the stator elements and the spokes facing the diaphragm are coplanar.

In another aspect, the present disclosure further provides an electro-acoustic conversion device applying the microelectromechanical system described above. The electro-acoustic conversion device may be a microelectromechanical system microphone.

BRIEF DESCRIPTION OF THE DRAWINGS

In order to explain the technical solutions of the embodiments of the present disclosure more clearly, accompanying drawings used to describe the embodiments are briefly introduced below. It is evident that the drawings in the following description are only concerned with some embodiments of the present disclosure. For those skilled in the art, in a case where no inventive effort is made, other drawings may be obtained based on these drawings.

DESCRIPTION OF THE EMBODIMENTS

Figure 1:
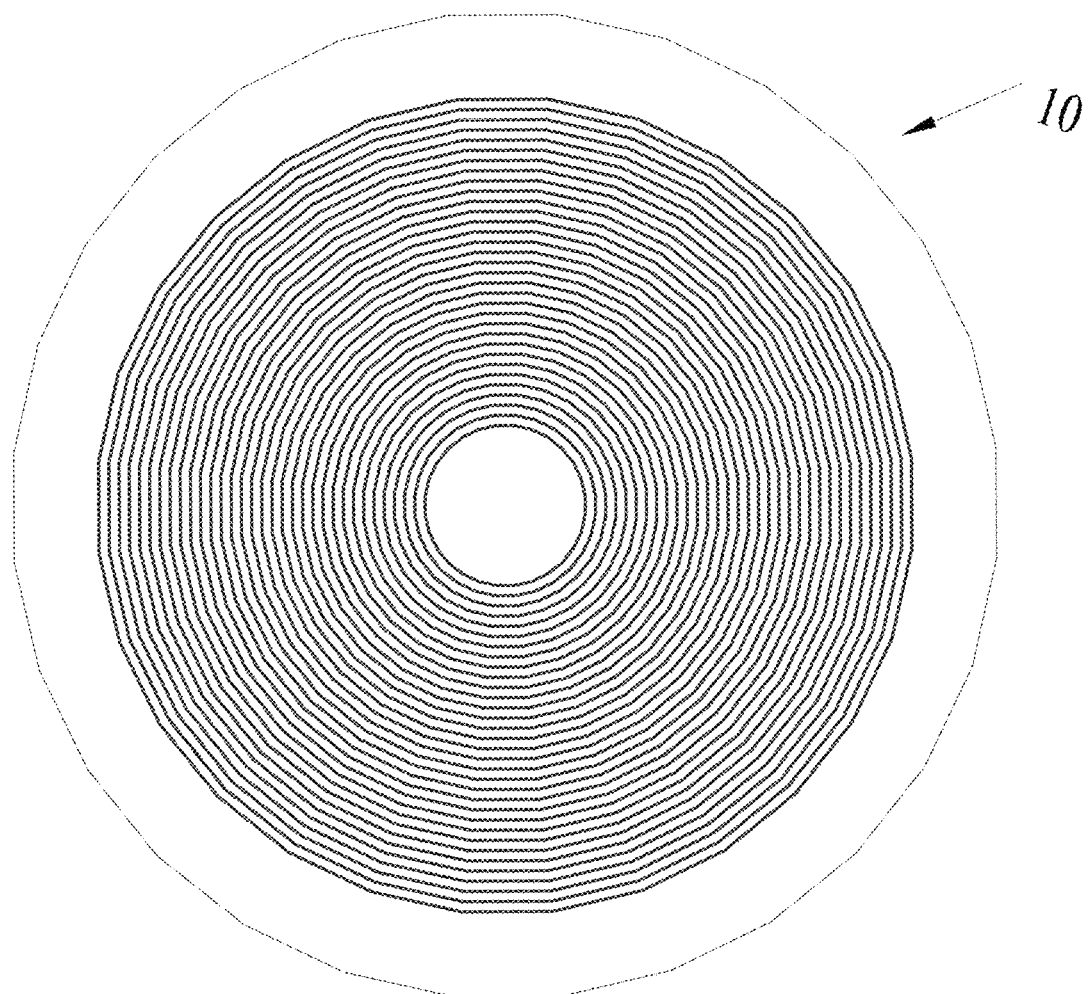
FIG. 1 illustrates a microelectromechanical system in accordance with an exemplary embodiment of the present disclosure.
Figure 2:
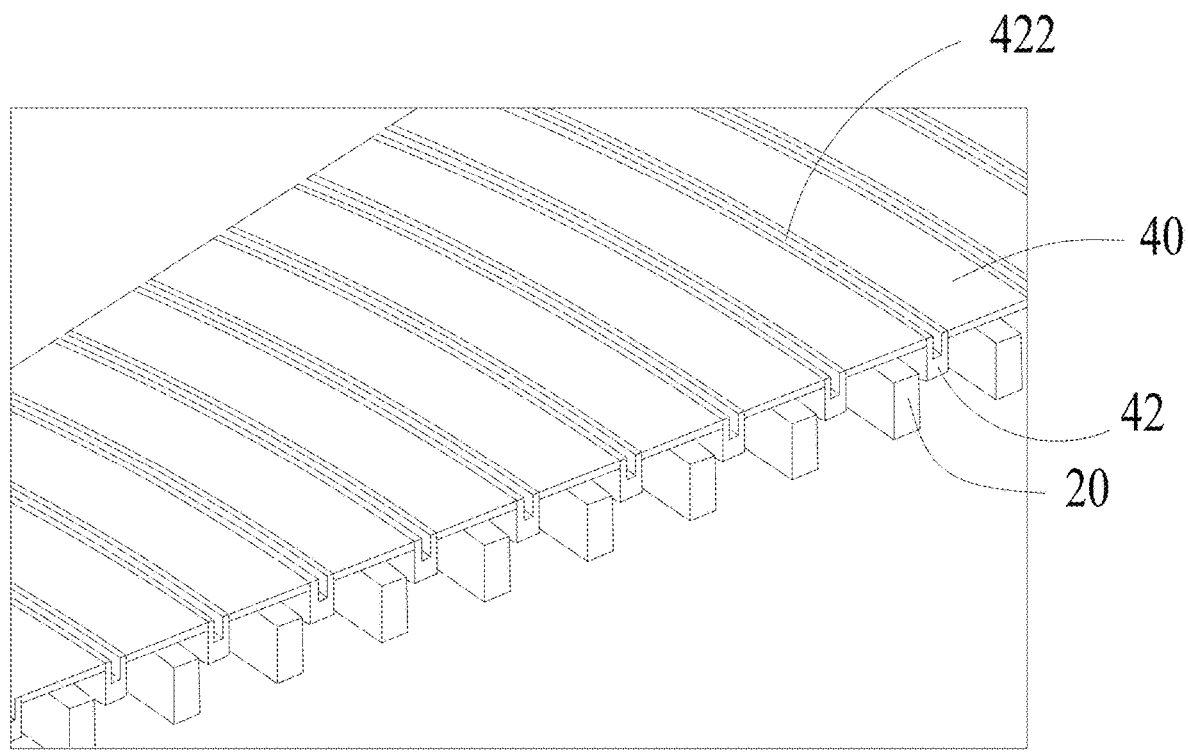
FIG. 2 is an enlarged view of a portion of the microelectromechanical system of FIG. 1.
Figure 3:
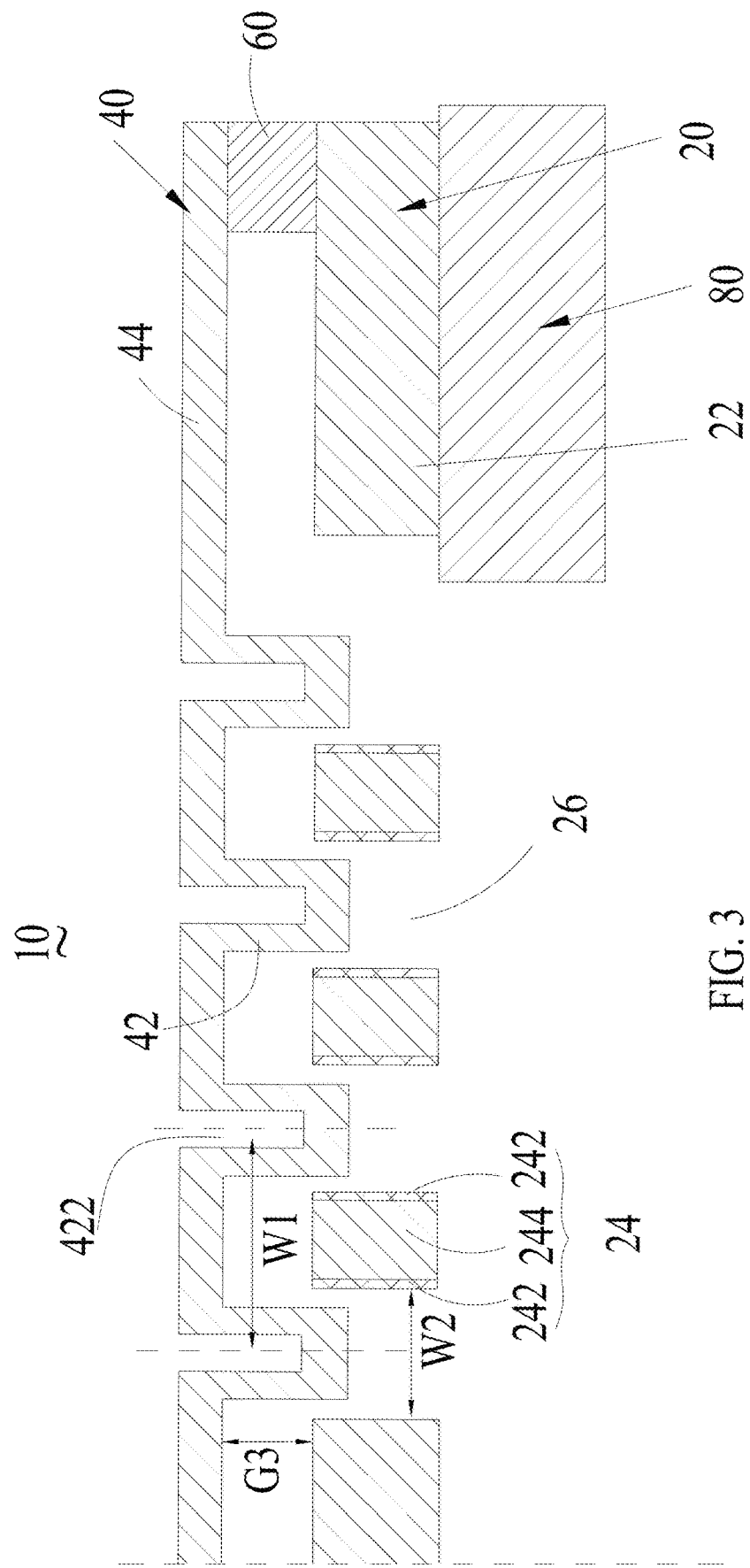
FIG. 3 is an enlarged cross sectional view of a portion of the microelectromechanical system of FIG. 1.
Figure 4:
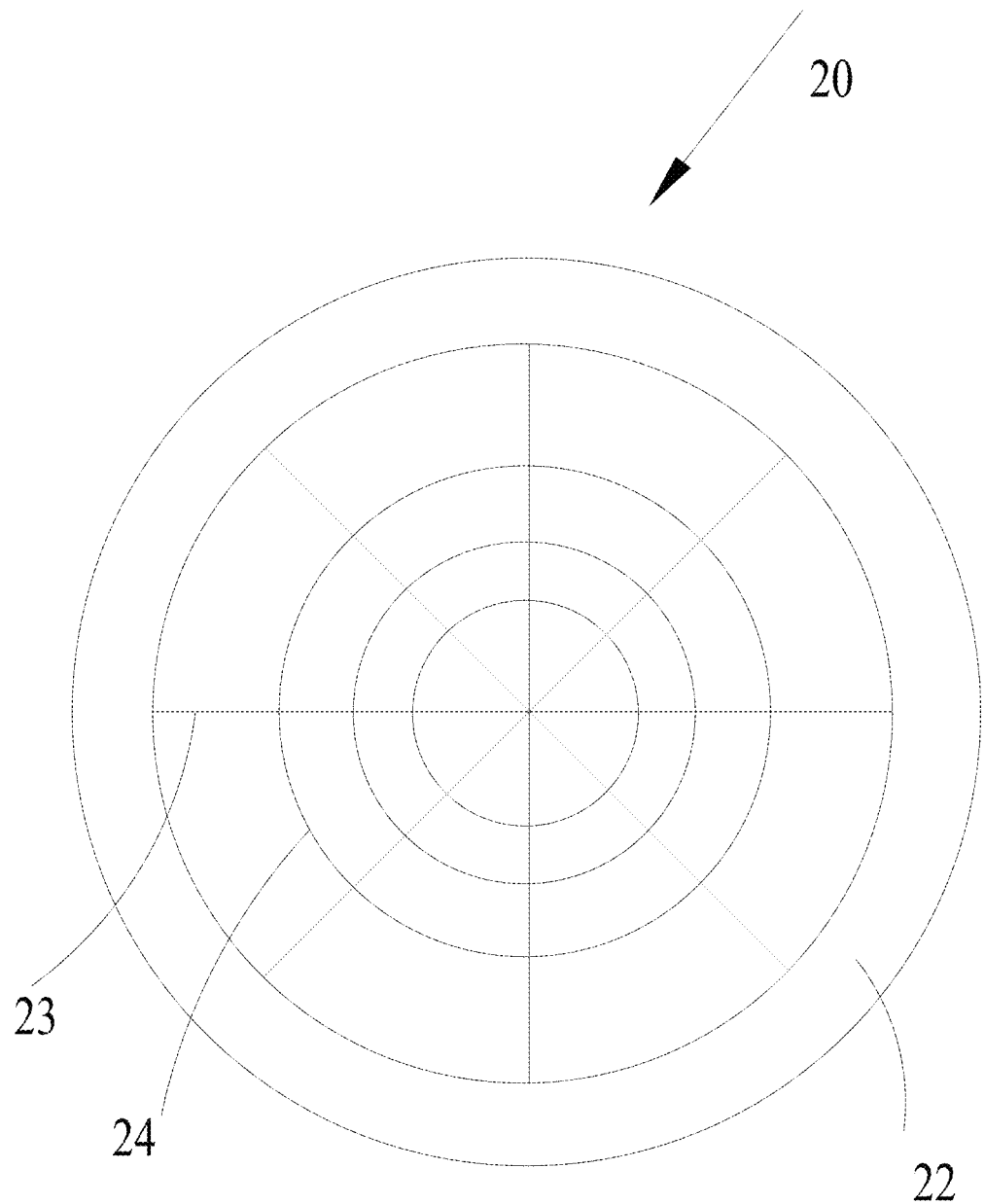
FIG. 4 illustrates a back plate of the microelectromechanical system of FIG. 1.

The present disclosure will be further illustrated with reference to the accompanying drawings. It shall be noted that the elements of similar structures or functions are represented by like reference numerals throughout the figures. The embodiments described herein are not intended as an exhaustive illustration or description of various other embodiments or as a limitation on the scope of the claims or the scope of some other embodiments that are apparent to one of ordinary skills in the art in view of the embodiments described in the Application. In addition, an illustrated embodiment need not have all the aspects or advantages shown.

Referring to FIG. 1 to FIG. 4, a microelectromechanical system 10 comprises a backplate 20, a diaphragm 40 moveable with respect to the backplate 20 in response to a pressure exerted thereon, and an insulator 60 arranged between a peripheral portion of the diaphragm 40 and a peripheral portion of the backplate 20. In some embodiments, the microelectromechanical system 10 further comprises a substrate 80 on which the backplate 20 is mounted.

The backplate 20 comprises an anchor 22 mounted on the substrate 80, a plurality of spokes 23 extending from the center of the backplate 20 to the anchor 22, and a plurality of stator elements 24 suspended by the spokes 23. In some embodiment, the anchor 22 and stator elements 24 are arranged in concentric rings. The spokes 23 extend in radial directions. The stator elements 24 may protrude beyond surfaces of the spokes 23 facing the diaphragm 40. Alternatively, the stator elements 24 are formed between adjacent spokes 23 and the surfaces of the stator elements 24 and the spokes 23 facing the diaphragm 40 are coplanar. The stator elements 24 are attached to or integrally formed with the spokes 23. The spokes 23 may be made of conductive material or insulating material. Preferably, the spokes 23 is made of material with low density enough to suspend the stator elements 24 in position only. The stator elements 24 are spaced from each other with voids 26 formed therebetween. The stator element 24 comprises first conductive elements 242. In some embodiments, the stator elements 24 are made of a conductive material which acts as the first conductive elements 242. In some other embodiments, the stator element 24 further comprises an insulating element 244 and the first conductive element 242 is embedded in the insulating element 244 or coated on the surface of the insulating element 244. The voids 26 pass through the backplate 20. The voids 26 may be holes, apertures, openings and so on.

The diaphragm 40 comprises a plurality of corrugations 42 axially facing the voids 26 respectively. Each corrugation 42 comprises a groove 422 formed at a surface thereof away from the backplate 20. The corrugations 42 comprise second conductive elements 424 (shown in FIGS. 7-9). As the diaphragm 40 moves up and down with respect to the backplate 20, the corrugations 42 move in and out of the corresponding voids 26. The capacitance between the diaphragm 40 and the backplate 20 is primarily determined based on the overlap of the first conductive elements and the second conductive elements 424. That is, the further that the corrugations 42 extend into the void 26 thereby increasing the overlap of the first conductive elements and the second conductive elements 424, the greater the capacitance. Similarly, the less that the corrugations 42 extend into the voids 26 thereby decreasing the overlap between the first conductive elements and the second conductive elements, the less the capacitance. An electronic signal will be generated and output in response to change of the capacitance.

Each corrugation 42 extends along a first/longitudinal/circumferential direction. The corrugations 42 are evenly spaced from each other and arranged in rows along a second/transverse/radial direction. In a cross section perpendicular to the first/longitudinal/circumferential direction, the corrugations 42 may be U-shaped or V-shaped. Preferably, the middle line of the corrugation 42 and the middle line of the corresponding void 26 are aligned with each other and parallel to the moving direction of the corrugations 42. In some embodiments, the moving direction of the corrugations 42 is parallel to the axial direction of the diaphragm 40 and perpendicular to the first and second directions.

Figure 5:
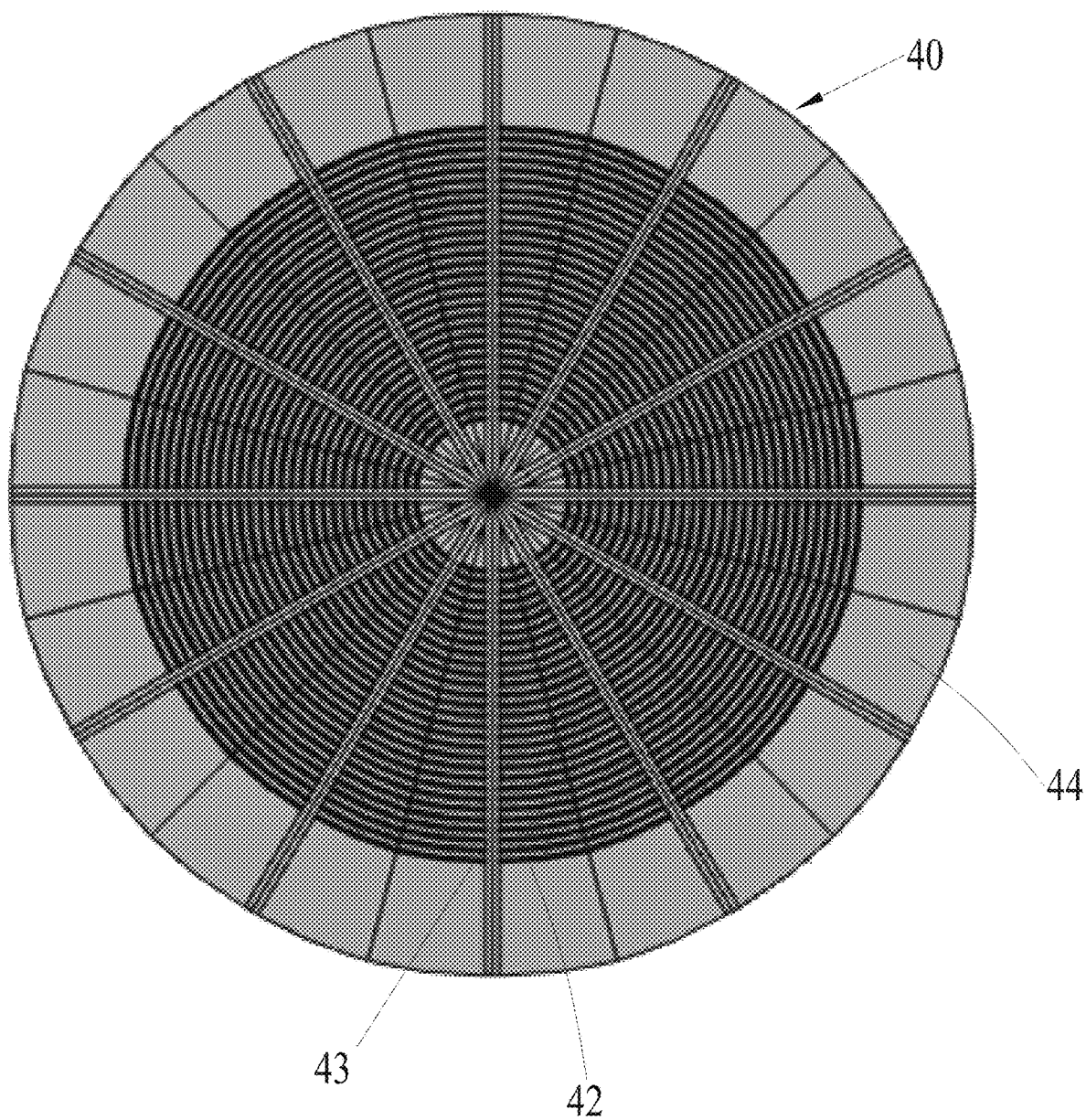
FIG. 5 illustrates a diaphragm of the microelectromechanical system of FIG. 1.
Figure 6:
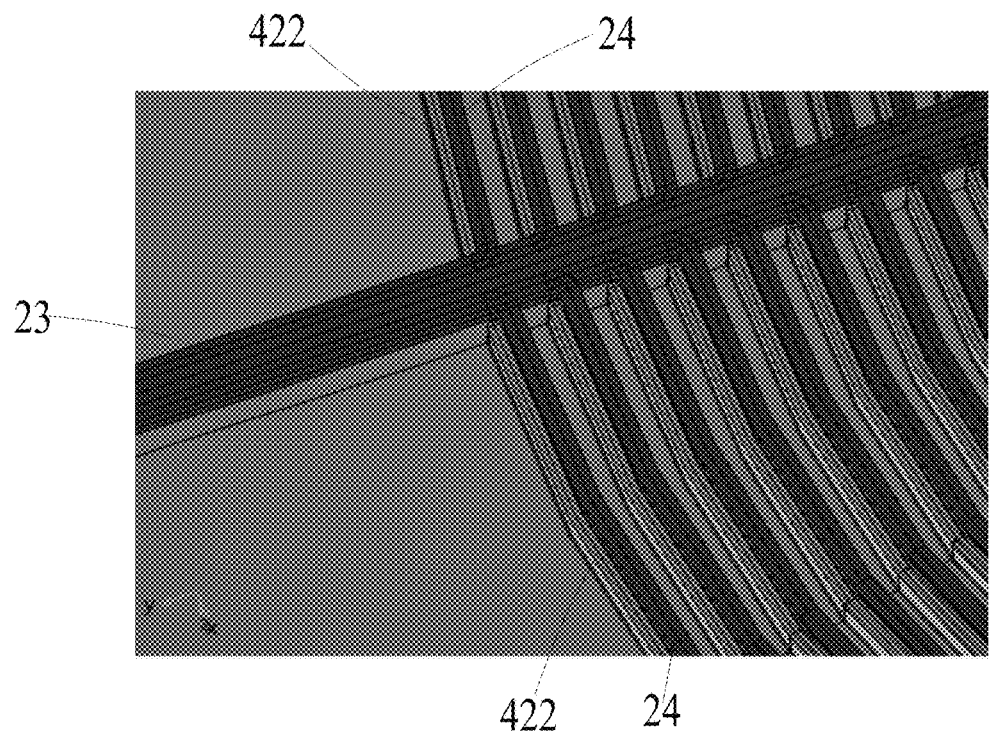
FIG. 6 illustrates a portion of the assembled back plate and diaphragm of the microelectromechanical system of FIG. 1.
Figure 6A:
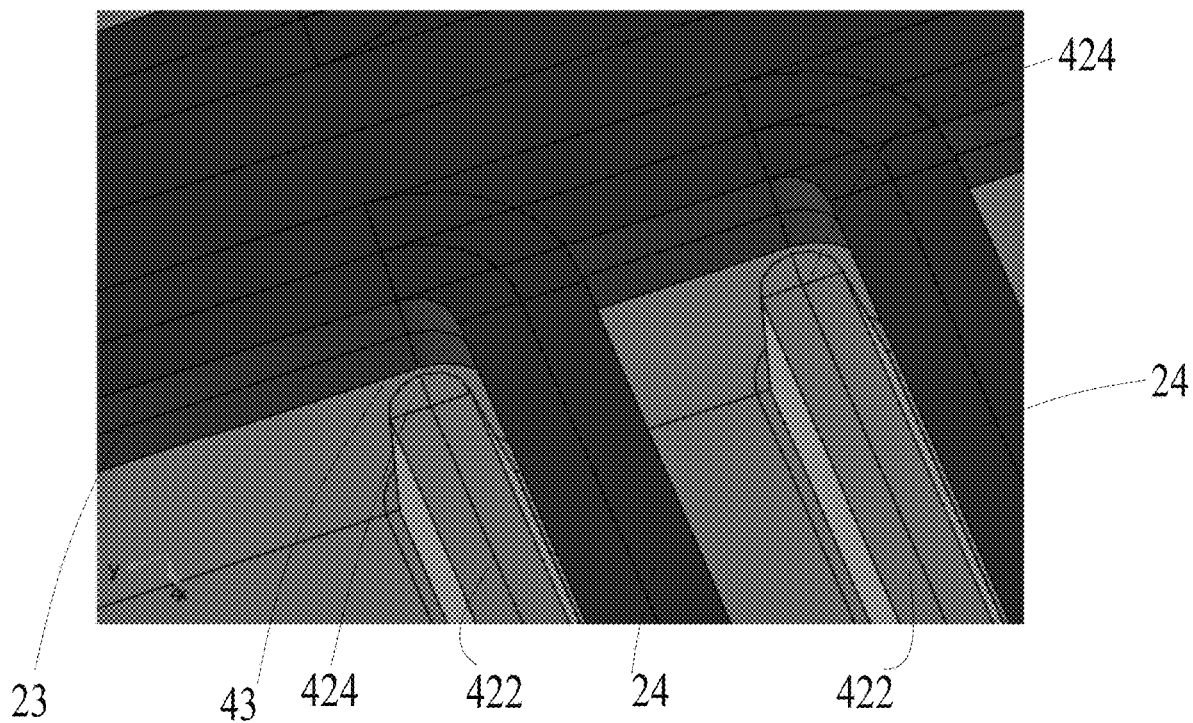
FIG. 6A is an enlarged view of a portion of FIG. 6.

Referring to FIGS. 5-6A, in some embodiments, the diaphragm 40 has a circle/round configuration and the corrugations 42 are arranged in concentric rings. In the case that the surfaces of the stator elements 24 and the spokes 23 facing the diaphragm 40 are coplanar or the extended height of the stator elements 24 beyond the surfaces of the spokes 23 facing the diaphragm 40 is less than the height of the corrugations 42, portions of the corrugations 42 aligned with the spokes 23 may define cutouts 43 to avoid interference between the corrugations 42 and the spokes 23 when the corrugations 42 are moved relative to the stator elements 24. In this embodiment, the surface of the diaphragm 40 facing the spokes 23 of the backplate 20 defines a plurality of slots extending radially. Portions of the slots located between adjacent configurations 42 form the cutouts 43 to allow the corresponding spokes 23 to pass through. That is, each ring of corrugation 42 comprises a plurality of corrugation sections 422 with cutouts 43 formed between adjacent corrugation sections 422. Opposite ends 424 of each individual corrugation section 422 terminate at the corresponding cutouts 43. Preferably, opposite ends 424 of the individual corrugation 422 extending toward the corresponding cutouts 43 are round. Alternatively, the diaphragm 40 has other configurations such as a rectangular configuration.

The width of the voids 26 in the second/transverse/radial direction is greater than that of the corrugations 42 such that the corrugation 42 can be inserted into the void 26 without interference. The distance W1 between middle lines of two adjacent corrugations 42 and the width W2 of the void 26 may be chosen to minimise the acoustic noise of the device applying the microelectromechanical system while maintaining an adequate operational capacitance. Preferably, the width W2 of the void 26 is in the range of 0.5 μm-6 μm, more preferably, 1 μm-3 μm, and the width W1 between the middle lines of adjacent corrugations 42 is in the range of 3 μm-20 μm, more preferably, 6-10 μm.

The diaphragm 40 further comprises a body 44 configured to suspend the corrugations 42 spaced from the backplate 20. The corrugations 42 extend from the body 44 toward the backplate 20. Preferably, the body 44 is made of an insulating material with high yield strength, including but not limited to Silicon Nitride, Silicon Carbide or certain other Oxides. The periphery of the body 44 is anchored to the periphery of the backplate 20 via the insulator 60. The periphery of the backplate 20 may be anchored to a substrate of the device such as microelectromechanical system microphone that applies the microelectromechanical system. The gap G3 between the stator elements 24 of the backplate 20 and the body 44 of the diaphragm 40 in the moving direction of the corrugations 42 is in the range of 1.5 μm-12 μm. Preferably, the gap G3 is in the range of 3 μm-6 μm.

Figure 7:
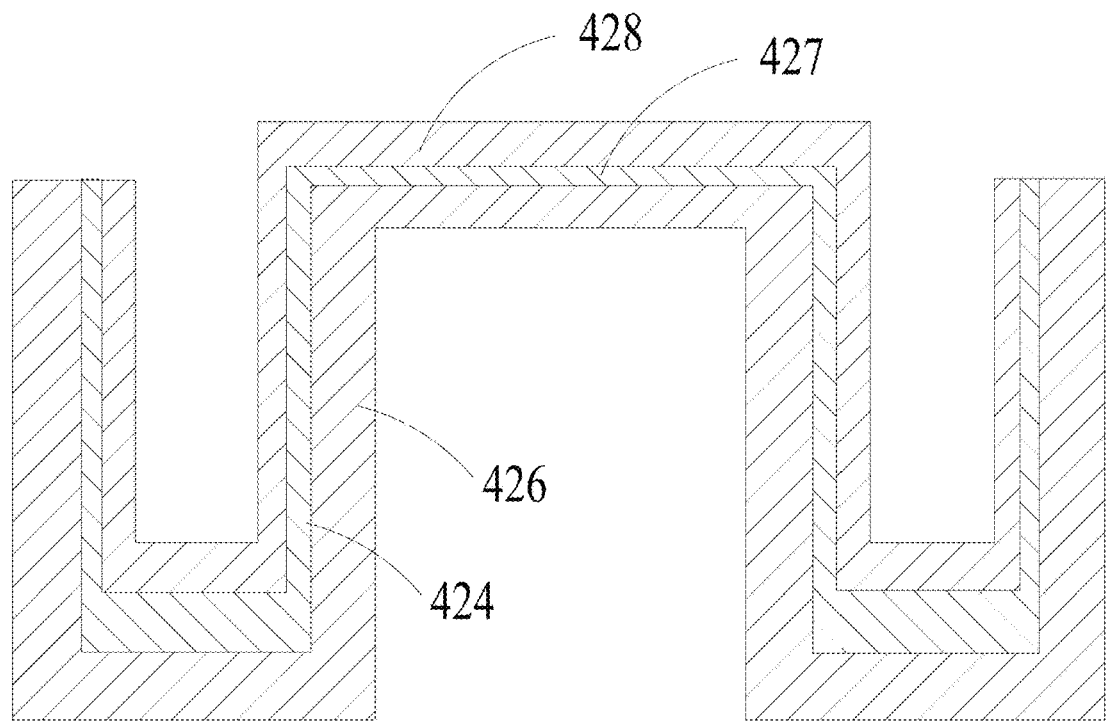
FIG. 7 to FIG. 9 illustrate corrugations in accordance with variety exemplary embodiments of the present disclosure.

Referring to FIG. 7, in some embodiments, the corrugation 42 further comprises an insulating corrugation part 426, and the second conductive element 424 is corrugation-shaped and embedded in the insulating corrugation part 426. Two adjacent second conductive elements 424 are connected with each other via a conductor 427 which is embedded in an insulating connecting portion 428 connected between adjacent insulating corrugation parts 426. Preferably, the second conductive elements 424 are made of a continuous film to thereby form a continuous second conductive element 424.

Figure 8:
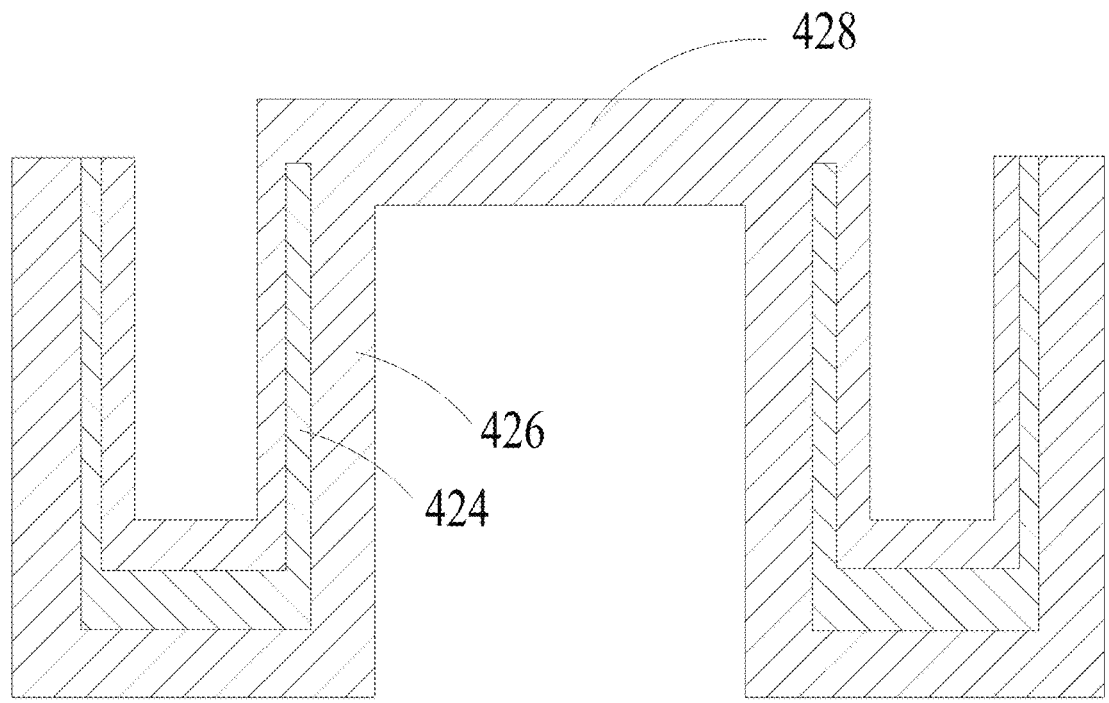

Referring to FIG. 8, in some embodiments, two adjacent second conductive elements 424 are disconnected/segregated from each other. Adjacent second conductive elements 42 may have different polarity biases for differential output.

Figure 9:
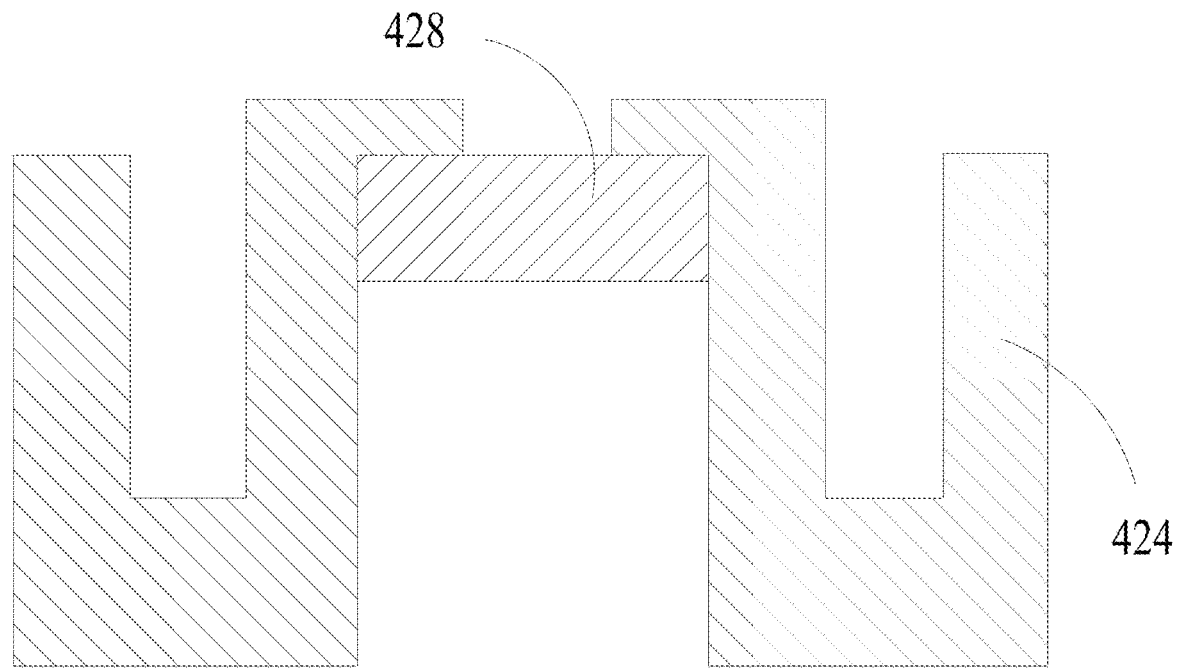

Referring to FIG. 9, in some embodiments, the whole corrugation 42 is made of conductive material and has no insulating part. That is, the second conductive element 424 is exposed to outside of the diaphragm 40. Two adjacent second conductive elements 424 are disconnected/segregated from each other and attached to the insulating connecting portion 428.

The second conductive elements 424 of the corrugations 42 can be made of material which includes but not limited to, Polysilicon and metallic elements or conductive barrier materials such as Titanium Nitride.

Figure 10:
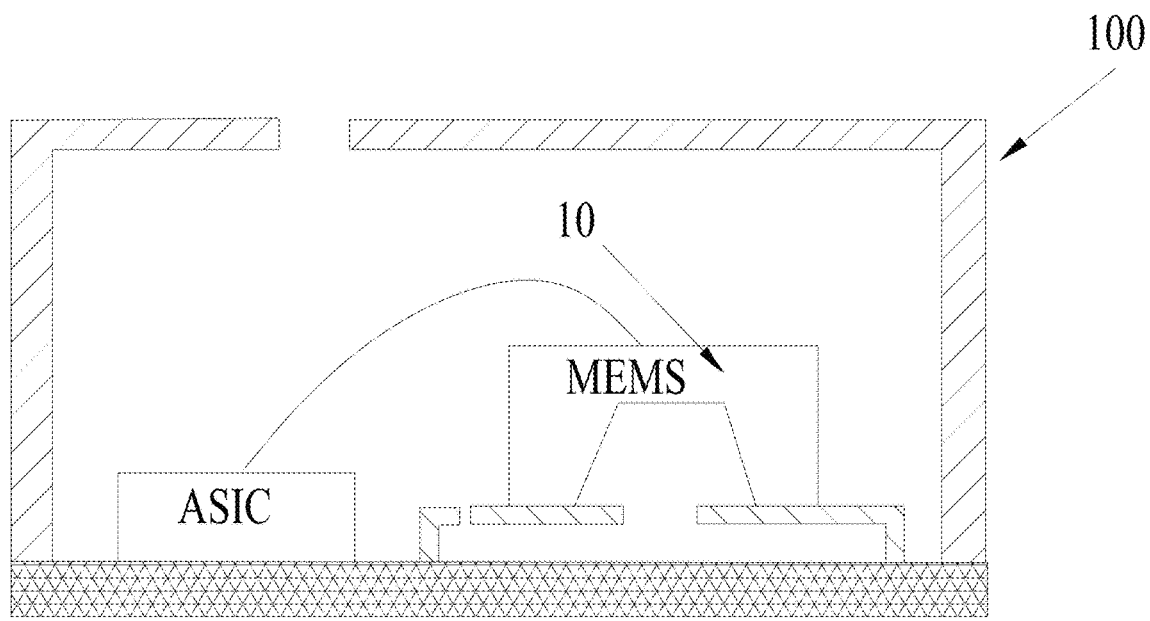
FIG. 10 illustrates an electro-acoustic conversion device in accordance with an exemplary embodiment of the present disclosure.

FIG. 10 illustrates an electro-acoustic conversion device 100 applying the microelectromechanical system 10. The electro-acoustic conversion device 100 further comprises an ASIC electrically connected with the microelectromechanical system 10. The electro-acoustic conversion device 100 may be a microelectromechanical system microphone or speaker.

In the embodiments of the present disclosure, the corrugations 42 are defined by grooves 422 formed at surfaces thereof away from the backplate 20, which facilitate to control the compliance of the diaphragm 40. Far from creating an unwanted increase in diaphragm stiffness as a conventional comb finger might, the grooves 422 of the corrugations 42 reduce the stiffness thereof effectively. When the corrugations 42 are moved to be adjacent to the stator conductive elements, a low noise transduction can be obtained, and squeeze film damping and turning resistance usually happened in parallel plate type microphones is avoided. The corrugation 42 can, when arranged axially on the diaphragm 40, be formed with much lower aspect ratios than traditional comb fingers, which allows it to be formed using standard front side processes and avoids the expense of expensive SOI type processes. Using of insulating high yield strength materials to form the body 44 of the diaphragm 40 and/or the insulating parts 426 of the corrugations 42 are benefit to increase the mechanical reliability of the device that applies the microelectromechanical system. The conductive elements 424 of the corrugations 42 can be segregated or continuous, allowing for the electrical arrangement of the device in differential formats, and can also be used to drive higher pull in voltages.

Although the invention is described with reference to one or more embodiments, the above description of the embodiments is used only to enable people skilled in the art to practice or use the invention. It should be appreciated by those skilled in the art that various modifications are possible without departing from the spirit or scope of the present invention. The embodiments illustrated above should not be interpreted as limits to the present invention, and the scope of the invention is to be determined by reference to the claims that follow.

What is claimed is:

1. A microelectromechanical system comprising:
   a backplate comprising a plurality of spaced stator elements with voids formed therebetween, the stator elements comprising first conductive elements; and
   a diaphragm comprising a plurality of corrugations facing the voids respectively, each corrugation comprising a groove formed at a surface thereof away from the backplate, the corrugations comprising second conductive elements and an insulating corrugation part;
   wherein the diaphragm is moveable with respect to the backplate in response to a pressure exerted thereon to cause the corrugations to be moved into or out of corresponding voids, thereby changing a capacitance formed between the first and second conductive elements, the second conductive element is corrugation-shaped and embedded in the insulating corrugation part, wherein two adjacent second conductive elements are disconnected from each other such that differential signals can be output via the two adjacent second conductive elements.

2. The microelectromechanical system of claim 1, wherein the diaphragm further comprises an insulating body configured to suspend the corrugations, and the insulating body is integrally formed with the insulating corrugation parts.

3. The microelectromechanical system of claim 1, wherein the diaphragm further comprises an insulating body configured to suspend the corrugations, the second conductive element is corrugation-shaped, and two adjacent second conductive elements are disconnected from each other and exposed to outside of the insulating body.

4. The microelectromechanical system of claim 1, wherein each corrugation extends along a first direction and the corrugations are arranged in rows along a second direction angled relative to the first direction.

5. The microelectromechanical system of claim 4, wherein in a cross section perpendicular to the first direction, the corrugations are U-shaped or V-shaped.

6. The microelectromechanical system of claim 1, wherein a middle line of the corrugation and a middle line of a corresponding void facing the corrugation are aligned with each other and parallel to moving directions of the corrugations.

7. The microelectromechanical system of claim 1 further comprising an insulator arranged between a portion of the diaphragm and a portion of the backplate.

8. The microelectromechanical system of claim 1, wherein a distance between middle lines of adjacent two corrugations is in a range of 3 μm to 20 μm.

9. The microelectromechanical system of claim 8, wherein the distance between the middle lines of adjacent two corrugations is in a range of 6 μm to 10 μm.

10. The microelectromechanical system of claim 1, wherein a distance between adjacent two stator elements is in a range of 0.5 μm to 6 μm.

11. The microelectromechanical system of claim 10, wherein the distance between adjacent two stator elements is in a range of 1 μm to 3 μm.

12. The microelectromechanical system of claim 1, wherein the diaphragm comprises a body configured for suspending the corrugations, and a distance between the body and the stator elements in a moving direction of the corrugations is in a range of 1.5 μm to 12 μm.

13. The microelectromechanical system of claim 1, wherein the backplate further comprises an anchor mounted on a substrate and a plurality of spokes extending from a center of the backplate to the anchor, the anchor and the stator elements being arranged in concentric rings, the stator elements being suspended by the spokes.

14. The microelectromechanical system of claim 13, wherein the diaphragm has a circular configuration and the corrugations are arranged in concentric rings; and each ring of corrugation comprises a plurality of spaced arcuate corrugation sections with cutouts formed between adjacent arcuate corrugation sections to allow corresponding spokes to pass through.

15. The microelectromechanical system of claim 14, wherein the arcuate corrugation section comprises a pair of opposite round ends each extending toward a corresponding cutout.

16. The microelectromechanical system of claim 13, wherein the stator elements protrude beyond surfaces of the spokes facing the diaphragm; or the stator elements are formed between adjacent spokes and the surfaces of the stator elements and the spokes facing the diaphragm are coplanar.

17. An electro-acoustic conversion device comprising the microelectromechanical system of claim 1.

* * * * *